United States Patent [19]

Hoffman

[11] Patent Number: 4,660,035
[45] Date of Patent: Apr. 21, 1987

[54] REMOTE MONITORING SYSTEM
[75] Inventor: Gary R. Hoffman, Glen Arm, Md.
[73] Assignee: General Services Engineering, Inc., Baltimore, Md.
[21] Appl. No.: 737,092
[22] Filed: May 23, 1985

Related U.S. Application Data

[62] Division of Ser. No. 374,626, May 3, 1982, Pat. No. 4,608,563.

[51] Int. Cl.⁴ .............................................. G08C 19/16
[52] U.S. Cl. ......................... 340/870.02; 340/870.19
[58] Field of Search .............. 324/137, 157, 207, 208, 324/226, 153, 156, 157; 340/870.02, 870.03, 870.19

[56] References Cited

U.S. PATENT DOCUMENTS 3,750,122  7/1973  Maeda .
4,296,411 10/1981  Romanelli et al. ............. 340/870.02
4,334,222  6/1982  Kelley et al. ............. 340/870.19 X Primary Examiner—Jerry W. Myracle
Attorney, Agent, or Firm—Leonard Bloom

[57] ABSTRACT

A wheel is mounted on a rotating shaft and cooperates with at least one pair of inductors fixedly mounted in juxtaposition to the wheel. The wheel has at least one opening formed therein for generating a signal whenever the opening in the wheel is substantially aligned circumferentially with the pair of inductors. An electronic control circuit, responsive to the signal, actuates a remote meter for providing a remote indication of the shaft position. In a preferred embodiment, this improved sensing means is applied to the remote reading of a conventional household electric meter. Two pair of inductors are provided for cooperation with five equiangularly-spaced closed slots formed in the wheel, thereby providing ten signals (or counts) for each complete revolution of the wheel. The wheel is mounted on the shaft of the unit decade dial in the meter. The remote meter comprises a digital counter, responsive to the pulse generated by the electronic control circuit, for providing a remote digital read-out of the accumulated kilowatt hours on the meter.

4 Claims, 10 Drawing Figures

REMOTE MONITORING SYSTEM

This application is a division, of application Ser. No. 374,626, filed May 3, 1982 now U.S. Pat. No. 4,608,563.

FIELD OF THE INVENTION

The present invention relates to remote means for monitoring the position of a shaft, or for monitoring the position of a wheel mounted on a rotating shaft, and more particularly, to an improved means for remotely monitoring the kilowatt hours recorded by the dial register of a standard electric service meter found in most homes as well as in commercial and industrial establishments.

BACKGROUND OF THE INVENTION

While not necessarily confined thereto, the present invention has immediate application to a household electric meter. While some electric meters are located external to the house, as in newer construction, nevertheless the large majority of existing meters are located in the basement of the house. This requires an employee of the utility company to enter the house to read the meter on a regular basis. Even if the home owner should elect to report the meter readings directly, an audit must be conducted occasionally. Because of the existing crime wave and the fear thereof, particularly burglaries, home owners are reluctant to provide a meter reader with a duplicate key, and sometimes are reluctant to allow the meter reader to enter the home while a member of the family is present. Moreover, from the meter reader's standpoint, the job has become increasingly hazardous because of fierce watch dogs, as well as various burglar protection equipment, and the possibility that the home owner may mistakenly perceive the meter reader to be an intruder.

In an attempt to alleviate these problems, others in the art have provided a remote register on the outside of the building to provide readings identical to the readings on the electric service meter within the building. However, none of these attempted solutions are entirely satisfactory and to date have not been commercially implemented on a widespread basis.

More specifically, one device currently available on the market uses a gear drive and a cooperating cam mechanism with mechanical "Form C" contacts as a generator to electrically drive a readable remote register. However, this mechanism adds friction to the meter-driving motor, which introduces potential errors in the reading. Besides, the mechanical "Form C" contacts are subject to problems caused by dirt and corrosion encountered in damp environments; and as a result, this solution is generally undesirable.

Another commercial device for providing a remote meter reading uses a friction-type of wheel monitor having sliding mechanical contacts While reducing friction to some extent, nevertheless, this device is subject to the same environmental problems and thus is also generally undesirable.

In the overall art of remote metering systems or telemetering systems, examples of the use of mechanical or electromechanical sensing devices are shown in U.S. Pat. Nos. 1,804,576; 2,286,180; and 3,153,780. While perhaps adequate for certain stated purposes, these prior art patents are also unsatisfactory for the intended purposes of the present invention.

Still another attempted commercial solution uses an infra-red photo-optic coupler as a generator for driving suitable recording equipment. While this technique provides frictionless wheel sensing, nevertheless, it is affected by high ambient light near saturation of the sensing cell and thus is restricted to a low ambient light operation. As a result, it is unsatisfactory where basement lights are turned on and off, or where rays of sunlight may enter through a basement window and impinge upon the coupler. In addition, no means is provided to accommodate free play or so called "backlash" of the wheel.

In the overall art of telemetering systems, examples of the use of photoelectric or photosensitive pick-up or sensing devices a are shown in U.S. Pat. Nos. 1,750,242; 3,943,498; and 4,281,325. Again, these devices are vulnerable to relatively high light intensity and thus are unsatisfactory for the intended purposes of the present invention.

The commercial prior art has also resorted to the use of a permanent magnet carried by a rotating shaft and cooperating with a magnetic reed switch or a Hall-effect device. However, this attempted solution exhibits poor resolution of the wheel position, especially in the limited space found within a standard household electric meter. Examples of the use of magnetic reed switches for remote telemetering systems are shown in U.S. Pat. Nos. 3,852,726 and 4,296,411. However, these patents are unsatisfactory for the intended purposes of the present invention.

Further, in U.S. Pat. No. 4,237,517, an apparatus is disclosed for monitoring the motion of a shaft used in a conveyorized apparatus. An insulated disc, driven by the shaft, carries a plurality of conductors which pass, sequentially, adjacent to an inductor energized by an oscillator circuit. The presence of the conductive material modulates the amplitude of the oscillations in the circuit. This sensing means produces a series of respective pulses, which cooperate with an electronic control circuit (including a ramp generator means) for monitoring the rate of shaft rotation. This '517 patent is intended for a different application and again, is unsuitable for the purposes intended herein.

Further, in the overall prior art of which I am aware, U.S. Pat. No. 4,001,815 discloses a rotary electromagnet indicator in which a cup-shaped rotor substantially encloses a stator having five salient poles provided with respective windings. The rotor has a hub rotatably mounted on a stub shaft mounted on a printed circuit board. The annular rim of the rotor carries a 0-9 digital sequence. A flat permanent magnet is carried by the rotor hub and has truncated salient magnetic poles formed along a diametral axis. Each of the poles has an angular width which is greater than the equiangular spacing of the stator pole faces by an amount no greater than the angular width thereof. The stator windings can be selectively energized to align a selected pole face of the p.m. rotor with a selected pole face of the stator. The arrangement is such that in each of the ten equiangularly-spaced read-out positions of the rotor, one of the poles on the p.m. (carried by the rotor) is centrally aligned with one of the five stator poles. While this structure is perhaps interesting, it is unsatisfactory for accomplishing the objectives of the present invention.

Still another sensing means is disclosed in U.S. Pat. No. 4,101,829. In this '829 patent, a ferromagnetic body has a pair of parallel bores formed therein to receive respective conductors. These parallel bores are connected by a communicating through slot. A third bore is formed in the body, at right angles to the parallel bores, for receiving a reed capsule switch. The purpose of this patent is to provide a differential current detector. Although interesting, it is nevertheless unsatisfactory for purposes of remote meter reading.

Thus, it will be appreciated that the prior art patents and commercial devices intended as solutions to a particular problem of long standing, namely, a remote meter reading means for household purposes, have been generally unsatisfactory. Accordingly, and to the best of my knowledge and belief, these devices have not been commercially successful to any appreciable degree. Moreover, the structures and circuits in the sum total of the prior art, while perhaps bearing a superficial resemblance to certain aspects of my disclosure, are nevertheless intended for altogether different applications and hence are wholly unsuitable for the intended purposes of my disclosure.

SUMMARY OF THE INVENTION

Accordingly, it is an object of the present invention to alleviate the disadvantages and deficiencies of the prior art by providing an improved sensing means for monitoring the position of a rotating shaft.

It is another object of the present invention to provide an improved sensing means which does not depend on mechanical contact or sliding friction.

It is yet another object to provide an improved sensing means which is not affected by ambient light and temperature conditions.

It is yet still another object to provide an improved sensing means which has good resolution, will accommodate wheel backlash, and will not produce erroneous output signals in the event of a power failure.

It is a further object of the present invention to provide a sensing means for the position of a wheel mounted on the rotating shaft, wherein a unique coupling of alternating electromagnetic fields is employed.

It is a still further object of the present invention to provide an electronic control circuit for cooperation with the improved sensing means, wherein the control circuit is responsive to an alternating current signal produced by the sensing means, and wherein the circuit in turn generates an output pulse for actuating a remote counter.

It is a yet still further object of the present invention to provide an electronic control circuit which generates a positive output pulse only in response to a direct "forward" movement of the wheel, thereby accommodating free play or backlash in the wheel, and thereby precluding erroneous or spurious readings by the remote counter.

It is yet again a further object of the present invention to provide a simple and economical kit for converting existing meter installations on a retrofit basis.

In accordance with the broad teachings of the present invention, an improved means is provided for monitoring the position of a rotatable shaft in a given apparatus. This means includes a wheel means mounted on the shaft for conjoint rotation therewith. The wheel means has at least one opening formed therein, and at least one pair of inductors are fixedly mounted in juxtaposition to the wheel means. Means are provided for energizing one of the inductors; and further means are provided, responsive to a substantial circumferential alinement between the opening and the pair of inductors, to generate a signal in the other inductor. Still further means are provided, responsive to the signal, for providing a remote indication of the shaft position.

In accordance with the further teachings of the present invention, the pair of inductors are mounted to one side of the wheel means and along an axis radially of the axis of rotation of the shaft, and the opening in the wheel means comprises a closed radial slot. Whenever the slot is substantially aligned circumferentially with the inductors, an inductive coupling occurs between the inductors to generate the desired signal.

In accordance with another aspect of the present invention, a first oscillator means is provided for energizing at least one of the inductors, and a second oscillator means is provided, responsive to the coupling between the inductors at a predetermined position of the shaft, for generating an output signal. A trigger means is provided, responsive to the output signal of the second oscillator means, to actuate a pulse generating means; and means, including a remote counter, are coupled to the output of the pulse generating means for providing an indication of the change in the shaft position.

A specific application of the teachings of the present invention comprises a remote counter for the unit decade dial of a conventional household-type of electric meter. The dial has a shaft, and a wheel is mounted on the shaft for conjoint rotation therewith. In a preferred embodiment, the wheel has five radially-projecting closed slots formed therein, the slots being equiangularly spaced around the circumference of the wheel. Two pairs of respective inductors are fixedly mounted in juxtaposition to the wheel. Means are provided for alternately energizing first, a "sending" inductor in one of the inductor pairs, and second, a "sending" inductor in the other inductor pair. The respective inductors in each pair are coupled together whenever one of the slots in the wheel is aligned circumferentially with one of the inductor pairs, respectively and sequentially. Means are provided, responsive to the coupling between the respective inductor pairs, to generate a signal; and electronic control circuit means are provided, responsive to the signal, for generating a pulse. This pulse actuates a remote digital counter (or register) for providing a remote digital read-out of the accumulated meter reading. Since there are five slots in the wheel, and two pairs of inductors which are alternately rendered "active", a total of ten pulses (or counts) are generated for each complete revolution of the unit decade dial in the meter.

These and other objects of the present invention will become apparent from a reading of the following specification, taken in conjunction with the enclosed drawings.

DESCRIPTION OF THE PREFERRED EMBODIMENT

Figure 1:
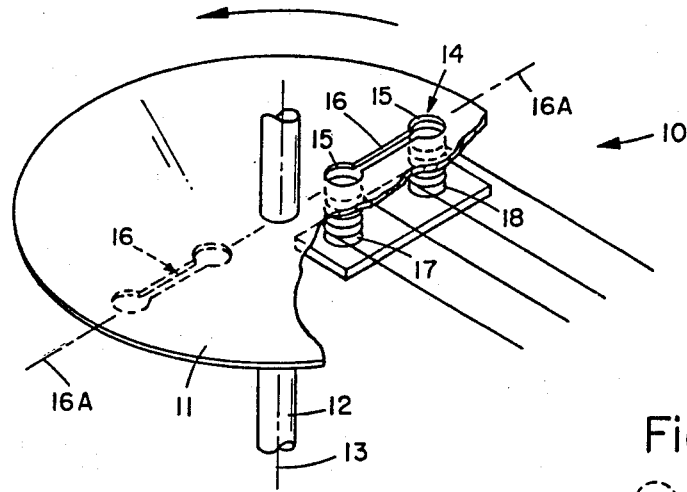
FIG. 1 is a pictorial view of one embodiment of the improved sensing means of the present invention, showing the coupling between a pair of inductors whenever the closed slot in the rotating wheel is in substantial circumferential alignment with the pair of inductors.

With reference to FIG. 1, there is illustrated one embodiment 10 of the improved sensing means of the present invention. In this embodiment, a wheel 11 is mounted on a rotating shaft 12 about an axis 13. The wheel (shown in fragmentary form for ease of illustration) has at least one closed slot 14 formed therein, radially of the axis of rotation. Preferably, the slot comprises a pair of enlarged circular openings 15 connected together by a slit 16 formed in the wheel. A pair of coils or inductors 17 and 18 are fixedly mounted adjacent to the wheel (or in juxtaposition to the wheel) along an axis 16A which is radial to the direction of the axis of rotation. These inductors are secured against movement in a suitable manner. One of the inductors may be energized by an alternating current (as by an oscillator means hereinafter described).

Whenever the slot 14 is aligned circumferentially with the pair of inductors 17 and 18, the inductors will be coupled together. The closed slot forms a coupling loop between the inductors, and a current will flow through and around the edges of the slot. More specifically, if an alternating current is applied to "sending" inductor 17, an alternating magnetic field will be developed around it. This alternating magnetic field, in turn, induces an alternating current which will flow around the edges of the slot in the wheel. Alternating current which will flow around the edges of the slot, thereby developing an alternating magnetic field around the "receiving" inductor 18, and thereby developing an alternating voltage at the terminal ends of inductor 18. If the wheel is then rotated to another position as indicated by the arrow, whereby the slot is no longer aligned with the inductors (as indicated by the broken lines in FIG. 1), solid metal is located over the inductors, and very little voltage will appear at the output terminals of the inductor 18.

Figure 2:
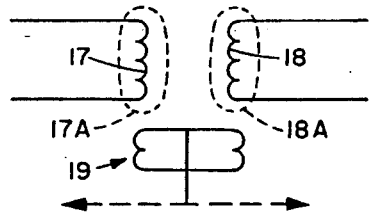
FIG. 2 is a schematic diagram thereof, showing the coupling between the inductors under the influence of the slot in the rotating wheel.

In FIG. 2, which is a schematic diagram of the improved sensing means of the present invention, the wheel and its slot are represented by the coupling loop 19. Again, when an alternating current is applied to sending inductor 17 and magnetically coupled through the loop 19, a voltage will be developed at the output terminals of the receiving inductor 18. The respective alternating magnetic fields are illustrated schematically by the broken lines 17A and 18A in FIG. 2.

With this arrangement, an improved pick-up of sensing means is available, not only for monitoring the position of a shaft, or the position of a wheel mounted on a shaft, but also for a variety of applications. One such application is a remote metering apparatus.

Figure 3:
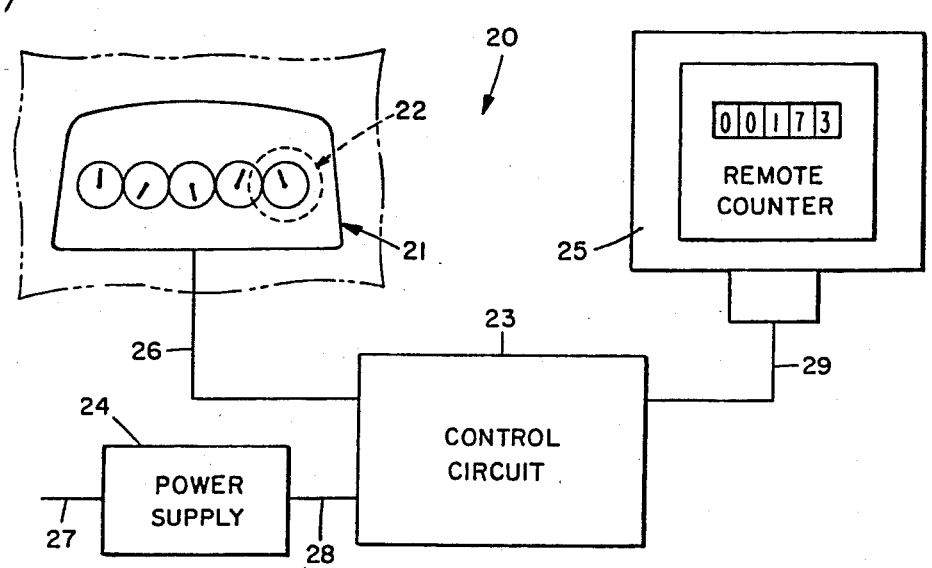
FIG. 3 is a schematic diagram of one application of the improved sensing means of the present invention (in this case, for the remote reading of a conventional household electric meter) showing in block diagram form the electronic control circuit and the regulated power supply.
Figure 4:
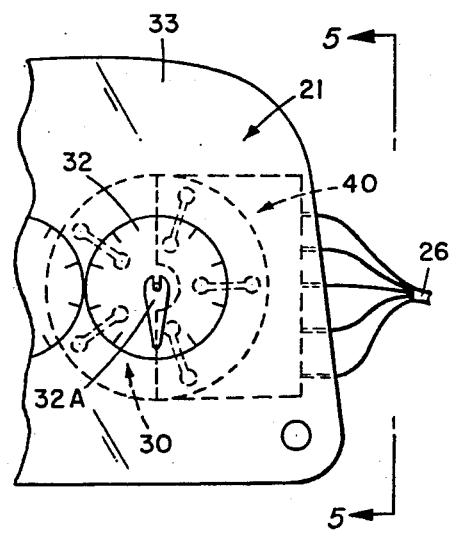
FIG. 4 is an enlarged portion of FIG. 3, showing (in broken lines) the mounting of the improved sensing means on the shaft of the least significant (or unit) decade dial of the meter.
Figure 5:
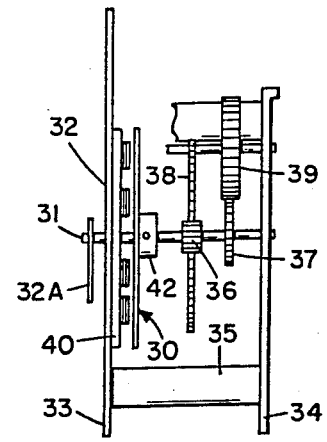
FIG. 5 is an end elevation thereof, taken along the lines 5—5 of FIG. 4.

Accordingly, and with reference to FIGS. 3-5, a preferred embodiment of the improved sensing means has been incorporated into an overall apparatus 20 for the remote monitoring of a conventional household-type of electric meter. The apparatus 20 generally comprises a register or dial portion 21 of a conventional meter, an improved sensing means denoted generally by 22, an electronic control circuit 23, a regulated power supply 24, and a remote meter or counter 25. The control circuit 23 may be physically packaged in a separate enclosure (which, being conventional, has been omitted for ease of illustration) and is connected to the improved sensing means by a suitable flexible cable 26, shown diagrammatically in FIG. 3 and partially in FIG. 4. The regulated power supply may also be housed in a separate encapsulated enclosure (not shown) and is provided with plug terminals 27 for convenient insertion into a standard available electric receptacle. It will be understood, however, that the necessary power may also be obtained from within the meter enclosure. Suitable cables 28 and 29, shown diagrammatically in FIG. 3, connect the power supply to the control circuit, and the control circuit to the remote counter, respectively. Although, any type of remote counter may be employed, a device which is described in U.S. Pat. No. 3,725,648 and is currently available on the market, has been found to be suitable for use with the present invention.

Figure 6:
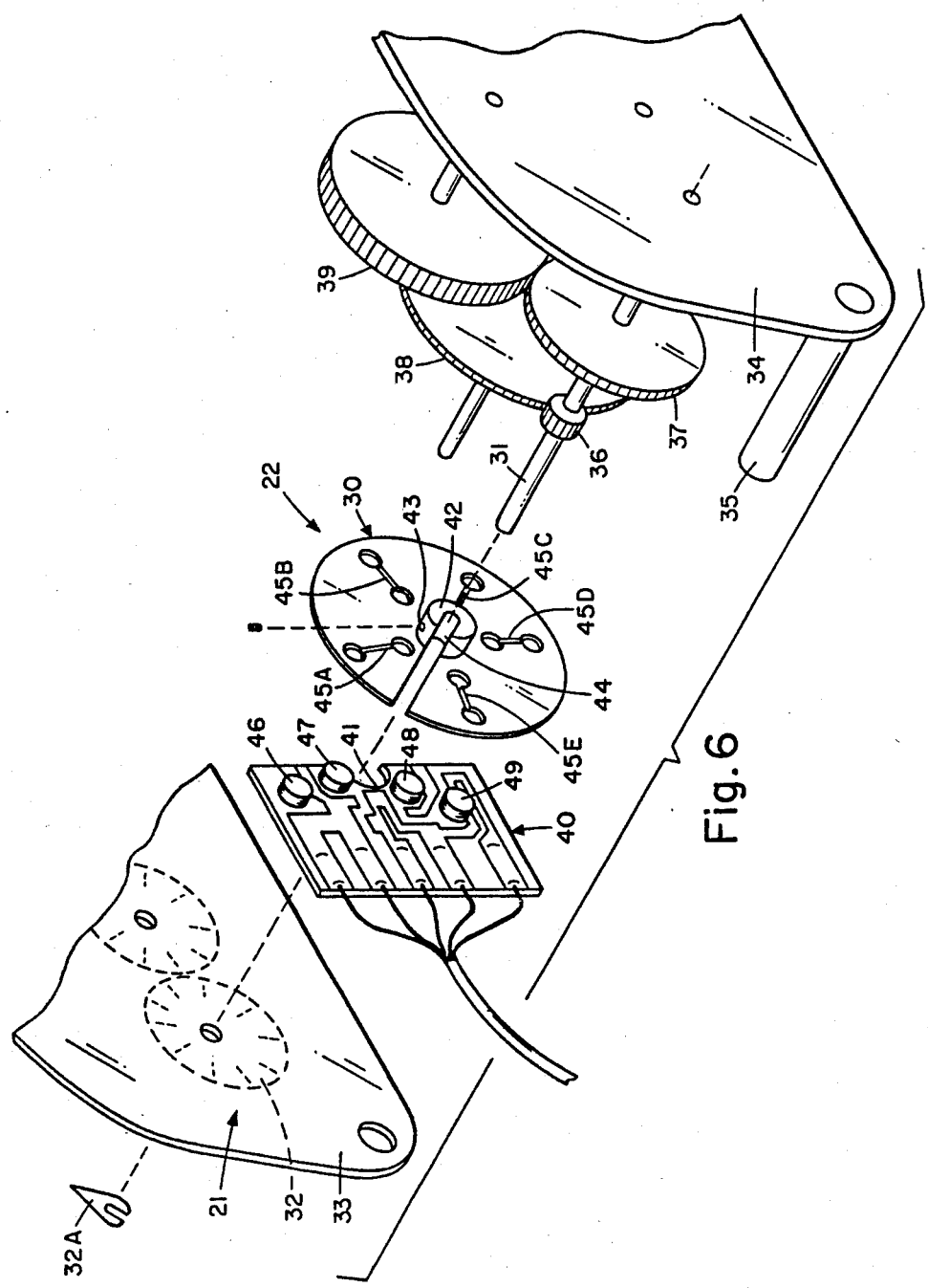
FIG. 6 is an exploded view, looking towards the rear of the dial portion of the meter, and showing a preferred embodiment of the improved sensing means of the present invention.

With reference again to FIGS. 4 and 5, and with further reference to FIG. 6, the improved sensing means 22 includes a wheel 30 mounted on the shaft 31 of the unit (or least significant) decade dial 32 of the meter portion 21, the dial being provided with a pointer 32A. The shaft is journaled in respective parallel panels 33 and 34, which are spaced apart by a spacer 35 and are secured together by suitable means. The shaft carries gears 36 and 37 for cooperation with gears 38 and 39, respectively; these gears are conventional and hence form no part of the present invention. A printed circuit ("p.c.") board 40 is mounted on the back of the front panel 33 in close proximity to the wheel 30. The p.c. board has an arcuate cut-out portion 41 for accommodating the rotating shaft on which the wheel is mounted. This enables the p.c. board to be mounted to the back of the front panel, sidewise, without requiring a disassembly of the meter portion 21. It will be appreciated, however, that the particular mounting of the p.c. board is a function of meter manufacture and thus will vary in different installations.

As shown more clearly in FIG. 6, the wheel 30 preferably comprises a relatively-thin and relatively-large disc, which is formed from a suitable metal. The wheel has a hub or collar 42 provided with a set screw (or allen screw) 43 for fixedly securing the wheel adjacent to, or in juxtaposition to, the p.c. board 40 and preventing relative movement between the shaft and the wheel. The wheel and its collar are provided with an open slot 44 for positioning the wheel over the shaft, sidewise, without requiring disassembly of the meter portion 21. The cut-out 41 on the p.c. board is preferably large enough to accommodate the wheel hub 42; and thus where space is more limited, the wheel hub 42 may be located in the cut-out 41 of the p.c. board. With this arrangement, meter portions equipped with the present invention may be completely assembled (economically at a central location) and then installed selectively out in the field as replacements for existing meter installations on a retrofit basis.

Figure 7:
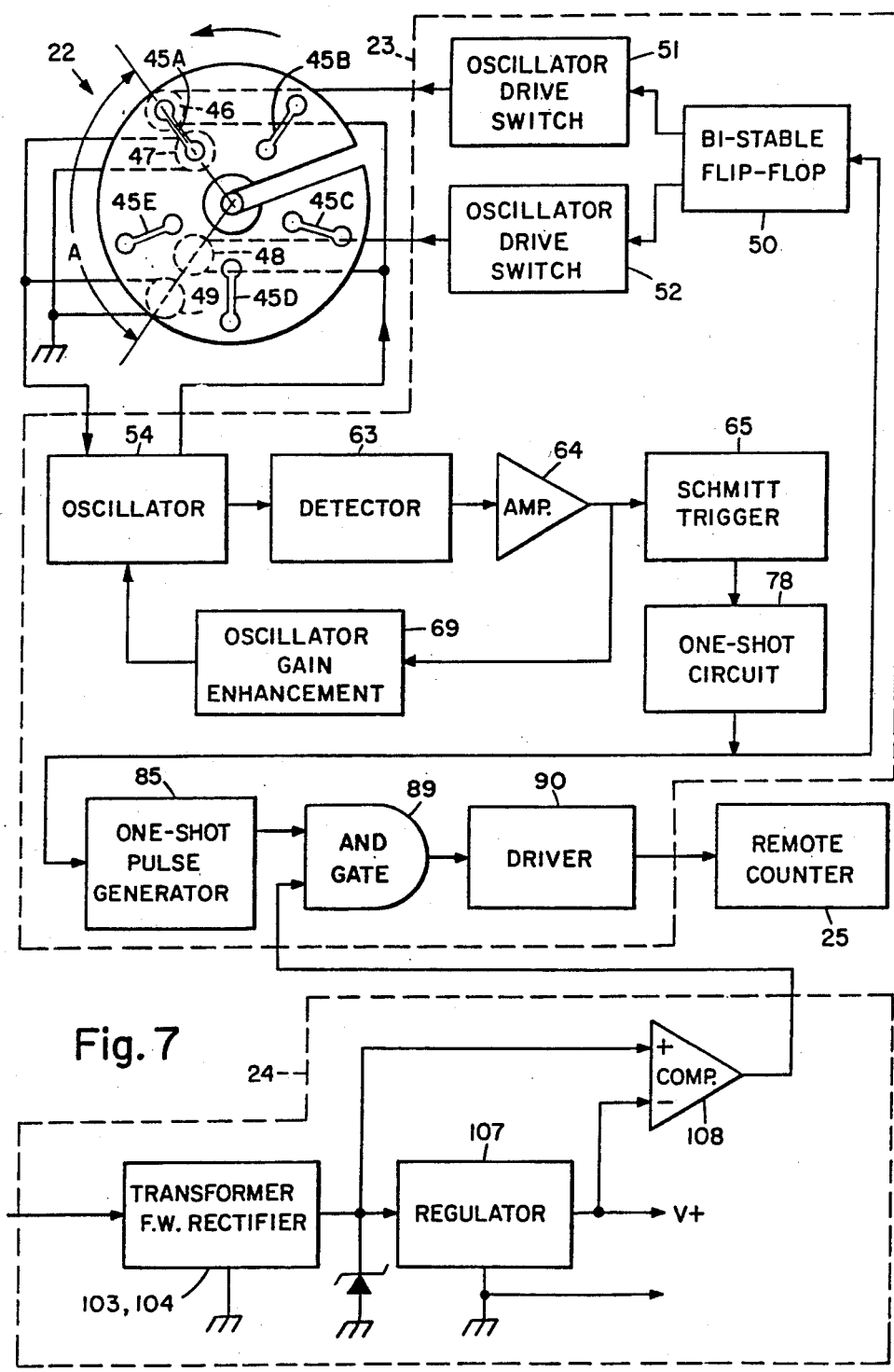
FIG. 7 is a functional block diagram of the overall remote telemetering apparatus of FIG. 3.

With reference again to FIG. 6, and with further reference to FIG. 7, the wheel 30 is provided with five (5) closed slots 45a–45e, each of which is similar to the slot 14 in FIG. 1. These closed slots are equiangularly spaced, being formed at seventy-two (72) degrees from one another. For cooperation with these five slots (as hereinafter described in detail) the p.c. board 40 carries two pairs of sensory elements comprising inductor pairs 46, 47 and 48, 49, respectively. These inductor pairs are each disposed along a radial axis from the axis of rotation of the shaft. In the embodiment of FIG. 7, the respective axes of the inductor pairs have been shown as subtending an angle of approximately 108 degrees. The reason for arranging the angular spacing between the inductors is as follows: Whenever one of the slots is lined up circumferentially with a respective pair of inductors, such as slot 45A with inductors 46, 47 in FIG. 7, the other pair of inductors (48, 49) will be disposed equidistantly between a pair of adjacent slots (45D, 45E in FIG. 7). This assures that whenever the inductive coupling between a pair of inductors is maximized, the inductive coupling between the other pair of inductors is minimized, thereby assuring that the signals from the respective pairs of inductors will not interfere with one another. It will be appreciated, however, that with a wheel having five slots (45A–45E) the axes of the inductor pairs could also subtend an angle of 36, 108, 180, 252 or 324 degrees, if desired. Moreover, with this overall arrangement, a total of ten pulses will be generated for each complete revolution of the wheel 30. Thus the wheel and its cooperating inductors may be used to count the kilowatt hours on the unit (or least significant) decade dial 32, and ultimately, to provide a digital readout on the remote counter of the total kilowatt hours consumed.

Figure 8:
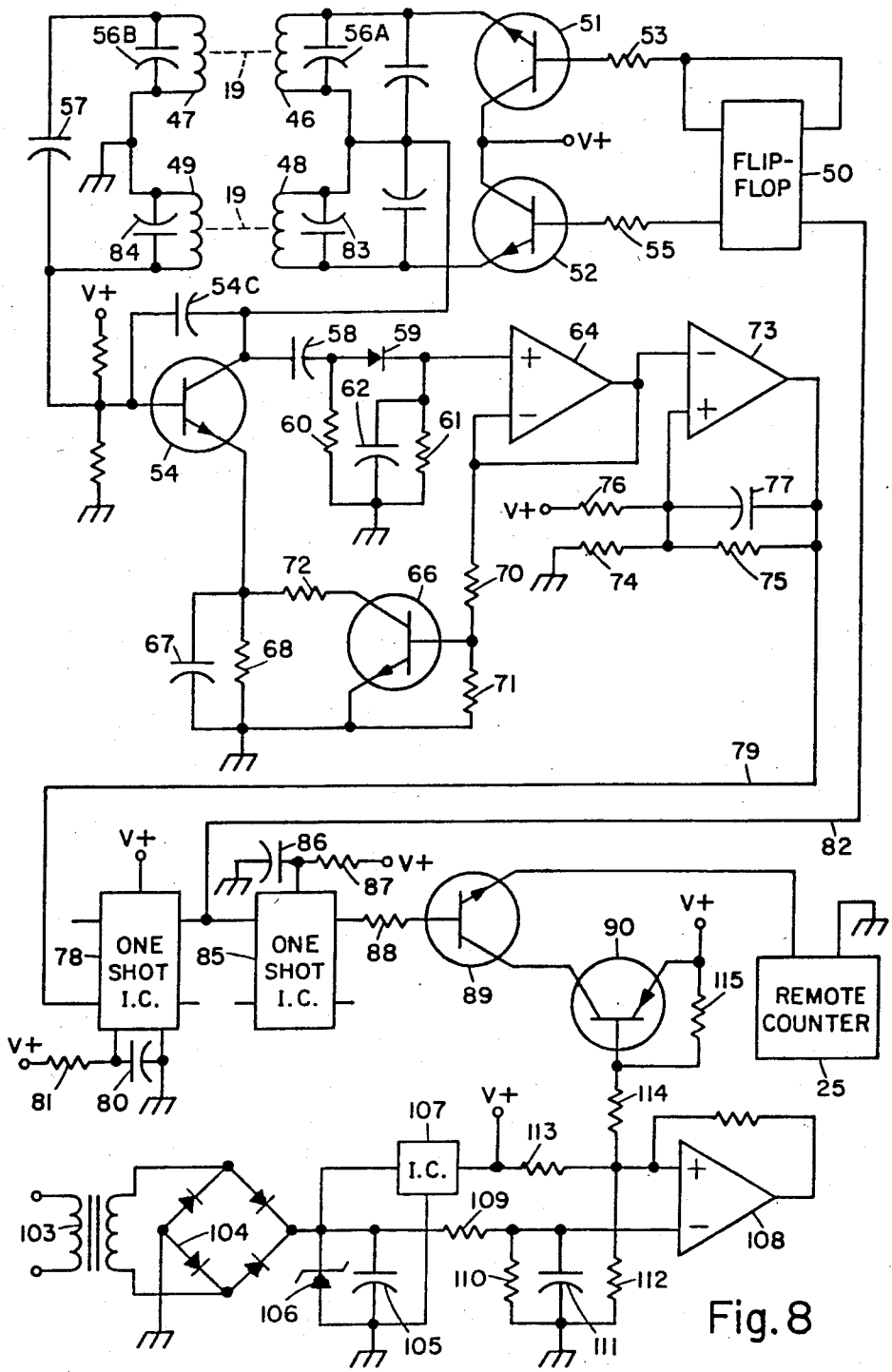
FIG. 8 is a schematic circuit diagram of the overall apparatus of FIG. 7.

With reference again to FIG. 7, and with further reference to FIG. 8, a preferred embodiment of the control circuit 23 includes a flip-flop bi-stable circuit 50 for alternately (or sequentially) driving a pair of oscillator drive switches 51 and 52, which in turn alternately energize the inductors 46 and 48 in the two inductor pairs 46, 47 and 48, 49, respectively. As the wheel 30 rotates, the closed slots 45A–45E in the wheel alternately pass over inductors 46–49. When the Q output of the flip-flop bi-stable circuit 50 is high, a direct current will be supplied through a current-limiting resistor 53 to the base of the switching transistor (comprising the oscillator drive switch 51) and then to inductor 46. As a result, current is supplied through inductor 46 to the collector of a transistor oscillator 54. At the same time, no current is being supplied through a current limiting resistor 55 to a transistorized oscillator drive switch 52, and thus the current supplied to inductor 48 is turned off. Capacitors 56A and 56B are used to resonate inductors 46 and 47, respectively, at a frequency of preferably 200 kiloherz; and inductor 47 is connected to the base of transistor 54 through a D.C. coupling capacitor 57.

When one of the slots in the wheel 30 (such as slot 45a) is not aligned with, nor sufficiently close to, inductors 46 and 47 to provide a coupling therebetween, the oscillator 54 is in a stable state. However, when the wheel 30 has been rotated towards a position in which the slot 45a starts to inductively couple inductors 46 and 47 together (and ultimately becomes circumferentially aligned as shown in FIG. 7) a sufficient noise signal voltage is developed at the terminals of the receiving inductor 47 to sustain a coherent oscillation in transistor 54. In a preferred embodiment, this oscillating state is maintained for a period of ten to thirty microseconds.

The oscillator buildup and termination sequence is as follows: Capacitor 58, diode 59, resistors 60 and 61, and capacitor 62 comprise a detector circuit 63 (which is shown in block diagram form in FIG. 7). The alternating voltage from oscillator 54 is coupled through capacitor 58, and capacitor 62 is charged to a fixed D.C. voltage through the diode 59. Resistor 60 (which is in the order of 10 kilohms) provides a D.C. source impedance for the detection process. Resistor 61, which is typically much higher in value (in the order of 250 K) serves to discharge capacitor 62 and acts as a D.C. load for diode 59 and a D.C. return for an operational amplifier 64. This operational amplifier 64 constitutes a voltage follower for a Schmitt trigger 65 and also provides a current source for a transistor amplifier 66.

This transistor amplifier 66, together with a capacitor 67 and a current limiting resistor 68, control the level of oscillations and comprise the oscillator gain enhancement circuit 69 (shown in block diagram form in FIG. 7). When an oscillation is detected through diode 59, a DC voltage appears at the output of the operational amplifier 64. This output voltage is used to increase the oscillation level by developing a voltage at the base of transistor 66 through resistors 70 and 71. Transistor 66 serves as a switch and decreases the emitter load of transistor 54 to a value determined by a resistor 72. At that time, the oscillation state in transistor 54 develops a higher energy level and through the detector diode 59, produces a higher output voltage from the operational amplifier 64. This D.C. feedback process is used to enhance the level and speed of the detection process.

Moreover, a capacitor 54C is preferably connected between the collector and the base of transistor 54. Since the normal phase through transistor 54 at low frequencies would be 180 degrees, and since the phase shift through resonators 46, 56A and 47,56B and coupling slot 45A is much less than 180 degrees, capacitor 54C serves to phase establish the oscillator transistor 54. Phase changes in coupling between inductors 46 and 47 through slot 45A are used advantageously, since coupled phase through slot 45A is more ideal for sustaining an oscillation in transistor 54.

The Schmitt trigger 65 comprises an operational amplifier 73, resistors 74, 75 and 76, and a capacitor 77. This Schmitt trigger is a threshold circuit which provides a sharp falling edge at the output of its operational amplifier 73, whenever a voltage of a predetermined level is presented to its negative input. Normally, the output of the Schmitt trigger would be saturated high and would be switched to a saturated low state when the threshold value is exeeded, thereby supplying a negative-sloped edge to the pulsed input of a one-shot integrated circuit 78 via a conductor 79. A predetermined threshold level is established by the values of resistors 74-76. After the output of the operational amplifier 73 changes to a low state, a new (and lower) threshold voltage is established through the feedback resistor 75. Capacitor 77 provides positive feedback and reduces the switching time of the output edge of the pulse. Thereafter, when the negative input to the operational amplifier 73 drops below the new (and lower) threshold value, the output of the operational amplifier 73 will return to a saturated high state.

The one-shot integrated circuit 78 generates a positive relatively-narrow rectangular output pulse from a negative edge pulse generated by the Schmitt trigger 65. The duration of this pulse generated by circuit 78, which is determined by a capacitor 80 and a timing resistor 81, is typically in the order of ten microseconds. The output pulse from the one-shot circuit 78 is supplied to the clock input of the bi-stable flip-flop circuit 50 via a conductor 82, thereby changing the Q output of the bi-stable flip-flop circuit from a high state to a low state, deactivating the respective inductor pair 46, 47, and terminating the oscillations in the oscillator 54. At the same time, the Q output of the bi-stable flip-flop circuit 50 changes to a high state and supplies current through the resistor 55 to turn on the transistor 52, thereby activating the second inductor pair 48, 49. Capacitors 83 and 84 serve to resonate inductors 48, 49, respectively.

When inductors 48, 49 are activated, inductors 46, 47 are no longer sensitive to the proximity of the slots, such as the slot 45a. As a result, the slot 45a may be passed back and forth over the inductors 46, 47 by an amount which is approximately plus and minus thirty degrees of rotation of the wheel 30 (for a total excursion of approximately sixty degrees) without activating the oscillator 54, since the inductors 46, 47 are inactive at that time. However, when the wheel is rotated so that the slot 45e is aligned with the second inductor pair 47, 48, another signal pulse is generated to produce another "count". Thereafter, the first inductor pair 46, 47 again become active, and the complete process is repeated. This arrangement accommodates relatively large amounts of free play (or "backlash") in the rotation of the wheel 30 (without triggering a spurious reading on the remote meter) and is thus an important advantage of the present invention.

As previously noted, the respective pairs of inductors 46, 47 and 48, 49 are alternately rendered active, being controlled by the bi-stable flip-flop circuit 50 via the oscillator drive switches 51 and 52, respectively. Each time this alternate switching process occurs, a positive pulse appears at the output of the one-shot circuit 78 and, as previously noted, is supplied to the clock input of the bi-stable flip-flop circuit 50. This positive output pulse is also supplied to the input of a one-shot integrated circuit 85, which produces a positive output pulse. The width of this output pulse is determined by a resistor 87 and a timing capacitor 86 and in a preferred embodiment, is set to approximately thirty milliseconds. This output pulse from the one-shot circuit 85, as shown in FIG. 8, is fed through a current limiting resistor 88 to the base of a switching transistor 89 (constituting an AND gate). This switching transistor supplies current through a normally "on" transistor 90, which comprises a driver for the remote counter 25. Each thirty millisecond pulse generated by the one-shot pulse generator 85 will advance the remote counter by one digit.

Figure 9:
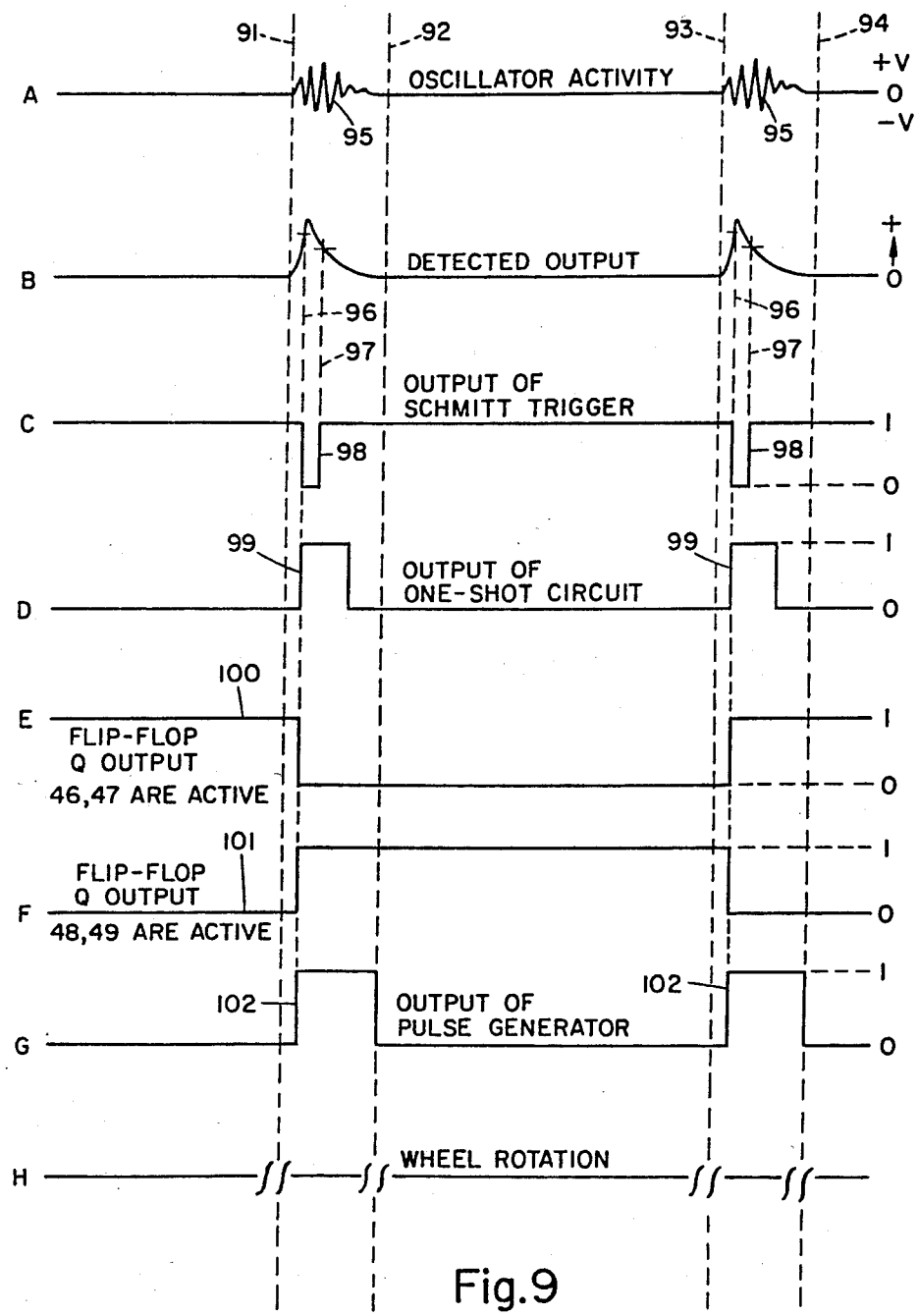
FIG. 9 is a timing diagram thereof.

The operation of the present invention may be further appreciated by reference to the timing diagram of FIG. 9, and more particularly, to FIGS. 9A–9H thereof. The first pair of inductors 46, 47 are active over the time duration denoted by the vertical broken lines 91 and 92, while the second pair of inductors are active over the time duration denoted by the vertical broken lines 93 and 94, respectively. FIG. 9A illustrates the typical oscillator burst, denoted as at 95, at the collector of the transistor oscillator 54. FIG. 9B illustrates the detected output at the operational amplifier 64, while FIG. 9C illustrates the output of the Schmitt trigger 65. The Schmitt trigger is on its threshold level for a time duration occurring between the broken lines 96 and 97; and thereafter, the Schmitt trigger is off its threshold level. The output of the Schmitt trigger is a negative pulse 98. FIG. 9D illustrates the pulsed output 99 of the one-shot integrated circuit 78; the width of this pulse, which is not critical, is in the order of ten microseconds. FIG. 9E and 9F illustrate, respectively, the Q output 100, 101 of the bi-stable flip-flop circuit 50 when the inductor pairs 46, 47 and 48, 49 are active. FIG. 9G illustrates the positive output pulse 102 generated by the one-shot integrated circuit 85. As previously noted, the width of pulse 102 is approximately thirty milliseconds in the preferred embodiment. Finally, FIG. 9H illustrates (diagrammatically) the wheel rotation. The time frame of the wheel rotation, in the preferred embodiment, may be in the range from milliseconds to weeks. It will be appreciated that when the respective inductor pairs are active, as denoted by the broken lines 91, 92 and 93, 94, the wheel rotation is not required.

With reference again to FIGS. 7 and 8, the regulated power supply 24 includes a supply transformer 103 and full-wave bridge rectifier 104 for converting A.C. to D.C. A filter capacitor 105 reduces ripple voltage. A Zener diode 106, which is normally non-conducting, reduces line transients or spikes. Integrated circuit 107 supplies a regulated plus voltage to various circuit points (as designated by V+). Operational amplifier 108 is configured as a voltage comparator, and unregulated supply voltage is sampled through resistors 109 and 110. Filter capacitor 111 provides a stable sample at the negative input to the operational amplifier 108. Resistors 112 and 113 form a voltage divider for sampling the regulated output voltage from the integrated circuit 107. Normally, the positive input to the operational amplifier 108 is lower than the unregulated sampled voltage at the negative input, thereby producing a normally low state at the output of the operational amplifier. Resistors 114 and 115 form another voltage divider network for maintaining a conducting state through transistor 90. If the unregulated voltage decreases below a predetermined level, as established by the resistors 112 and 113, the output of the operational amplifier 108 will switch to a high state, thereby interrupting the current through transistor 90. As a result, a low supply line voltage at transformer 103 will interrupt transfer of any pulses to the remote counter 25 during unstable conditions of low line voltage. This arrangement also interrupts the transfer of pulses which may be generated as a result of power interruptions and is an important advantage of the present invention.

Figure 10:
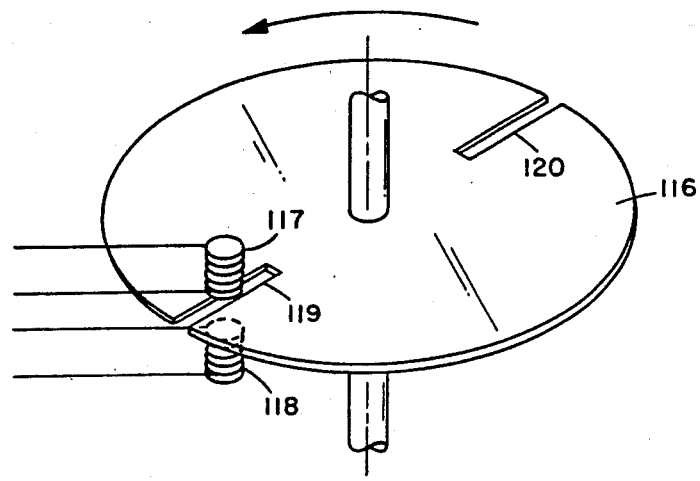
FIG. 10 is an alternate embodiment of the improved sensing means of the present invention.

With reference to FIG. 10, an alternate embodiment of the sensing means is illustrated. There, the wheel 116 is not used as part of the inductive coupling network. Instead, the wheel 116 acts as a shield to interrupt coupling between the stationary inductors (for example, inductors 117 and 118) which are positioned on respective sides of the wheel. Coupling between the inductors 117, 118 is provided through open-ended slots 119 and 120, which form a convenient break in the shielding wheel. The circuitry, previously noted with respect to the preferred embodiment of FIGS. 6–8, will be generally satisfactory for this alternate embodiment as well. This alternate embodiment may be more desirable for smaller diameter wheels.

While it will be understood that various sizes of inductors may be used (both smaller and larger) the inductors in the preferred embodiment are cylindrically shaped, having a diameter of approximately 0.90 inches and a height of approximately 0.90 inches.

Moreover, in the commercial embodiment, the following components were found to be suitable.

| Component | Source |
| --- | --- |
| Bi-stable flip-flop circuit 50 | Motorola MC14013B |
| Switching transistors 51, 52 | Motorola 2N2222 |
| Detector diode 59 | Motorola 1N4148 |
| Operational amplifier 64 | Motorola MC3403 |
| Transistor Oscillator 54 | Motorola 2N2222 |
| Switching transistor 64 | Motorola 2N2222 |
| One-shot circuit 78 | Motorola MC14528 |
| One-shot circuit 85 | Motorola MC14528 |

Obviously, many modifications may be made without departing from the basic spirit of the present invention. Accordingly, it will be appreciated by those skilled in the art that within the scope of the appended claims, the invention may be practiced other than has been specifically described herein.

I claim:

1. Apparatus for the remote reading of a household-type of meter having a meter portion provided with a front panel for a plurality of decade dials, including a unit decade dial cooperating with a point mounted on a rotating shaft journaled in the panel, the apparatus comprising a printed circuit board having sensing means carried thereon, means for mounting the board to the back of the panel, the board having a side edge with an arcuate cut-out formed therein to receive the shaft, whereby the board may be mounted to the panel without requiring a disassembly of the meter portion, a wheel comprising a relatively-thin disc mounted on the shaft rearwardly of the printed circuit board and in close juxtaposition thereto, the disc having an open radial slot formed therein for receiving the shaft as the disc is passed laterally over the shaft, whereby the disc may also be mounted on the shaft without requiring a disassembly of the meter poriton, means on the disc for cooperation with the sensing means on the printed circuit board for generating a signal at a predetermined positon of the shaft, an electronic control circuit responsive to the signal for generating an output pulse, and a remote counter responsive to the output pulse for providing a remote indication of the accumulated meter reading.

2. The combination of claim 1, wherein the printed circuit board is connected to the electronic control circuit by a flexible cable.

3. The apparatus of claim 1, further including an encapsulated regulated power supply for the electronic control circuit, the supply being provided with plug terminals for reception in a standard electric receptacle.

4. Apparatus for retrofitting an existing household-type of electric meter for the remote reading thereof, wherein the meter includes a unit decade dial cooperating with a shaft journaled for rotation in the meter, said apparatus comprising a disc mounted on the shaft, a printed circuit board mounted on the meter in juxtaposition to the disc, the board including a cut-out portion, sensing means including at least a pair of inductors mounted on the printed circuit board in juxtaposition to the cut-out portion, means on the disc for cooperation with the pair of inductors on the printed circuit board for generating a signal at a predetermined circumferential positon of the disc, means for generating a plurality of said signals, in sequence, corresponding to the continued rotation of the shaft, an electronic control circuit carried by the printed circuit board asnd responsive to the plurality of signals for generating respective output pulses, and a remote digital counter responsive to the plurality of output pulses for indicating the accumulated meter reading.

* * * * *